United States Patent [19]

Scott

[11] Patent Number: 4,642,580
[45] Date of Patent: Feb. 10, 1987

[54] STABILIZED MICROWAVE VARACTOR

[75] Inventor: Bentley N. Scott, Richardson, Tex.

[73] Assignee: Texas Instruments Incorporated, Dallas, Tex.

[21] Appl. No.: 761,463

[22] Filed: Aug. 1, 1985

Related U.S. Application Data

[63] Continuation-in-part of Ser. No. 598,564, Apr. 9, 1984, which is a continuation of Ser. No. 293,040, Aug. 14, 1981, Pat. No. 4,481,487.

[51] Int. Cl.⁴ .................. H01L 27/04; H03B 5/00
[52] U.S. Cl. ...................... 331/117 D; 331/177 V; 357/14; 357/15; 357/22
[58] Field of Search ........ 331/117 D, 117 FE, 177 V; 332/30 V, 36 C; 357/14, 15, 22

[56] References Cited

U.S. PATENT DOCUMENTS 4,310,809  1/1982  Buck et al. .................. 331/117 D
4,481,487 11/1984  Brehm et al. ................ 331/117 D Primary Examiner—Eugene R. LaRoche
Assistant Examiner—Robert J. Pascal
Attorney, Agent, or Firm—Carlton H. Hoel; James T. Comfort; Melvin Sharp

[57] ABSTRACT

A microwave varactor network wherein parametric oscillation modes are suppressed by coupling the varactor, with very low intervening impedance, to a bias regulator circuit (preferably an emitter follower circuit) through which the varactor bias voltage is supplied. The emitter follower is biased to always be carrying current, which improves its response time in compensating any transient bias voltage variations which appear across the varactor.

30 Claims, 6 Drawing Figures

Fig. 1 ANTI-BREAKUP CIRCUIT TOPOLOGY

STABILIZED MICROWAVE VARACTOR

CROSS REFERENCE TO RELATED APPLICATIONS

The present invention is a continuation-in-part of Ser. No. 598,564, filed 4/9/84, which was a continuation of Ser. No. 293,040, filed 8/14/81 and now issued as U.S. Pat. No. 4,481,487.

BACKGROUND AND SUMMARY OF THE INVENTION

The present invention relates to microwave varactor circuits, and in particular to microwave voltage-controlled oscillators.

Many varactors are prone to developing a significant resistive component over low-bias portions of their operating range. This resistance can lead to rectification of the RF signal appearing across the varactor. This rectified component will cause a rapid change in the varactor's capacitance, so that the varactor starts to behave like a parametric oscillator. This can lead to severe spectral breakup. This is extremely undesirable in many applications.

That is, it has been discovered that RF rectification in the varactors of a VCO can generate as much as 7 volts across the varactors. This causes a dynamic change in frequency, and the resulting change in power at the new frequency causes a change in the bias level seen by the varactor, which is now equal to the applied DC voltage plus the RF rectified voltage. This again changes the operating frequency of the oscillator. This action causes severe spectral breakup.

The present invention provides a network on the varactor tuning line which can sink the rf rectified current as it is generated. This network can sink the substantial amounts of RF current which can be supplied from the RF rectification (up to 30 mA in a sample application). Moreover, the current supplied by the network when operating near the breakdown voltage of the varactor is limited to less than 1 mA, to protect the varactor. Moreover, the regulated bias voltage is accurately controlled by the tuning voltage input to the network.

Temperature drift of the bias regulation network can be avoided by incorporation of the network into a common heated package with the VCO.

The present invention thus prevents the problems of spectral breakup. The bias voltage is supplied to the varactor through an emitter follower circuit, and the reactances between the emitter follower circuit and the varactor itself are kept as small as possible. The bias voltage of the varactor is thus actively stabilized, so that the rectified RF current cannot dynamically change the DC voltage across the varactor. Parametric oscillation modes are thus suppressed, and spectral breakup is avoided.

The circuit of the present invention has the further advantage of limiting the current as breakdown voltage of the varactor is approached, so that the device itself is better protected.

A further advantage of the present invention is that the bias voltage is not actively regulated at high bias voltages, but simply passed to the varactor through a resistive network. The problems of rectification of the RF signal are normally worst at the low bias values, so that active regulation at higher bias values is unnecessary, and its elimination avoids the possibility of other instabilities appearing.

The present invention is preferably embodied as an emitter follower circuit, but of course this is not necessary. The key teaching of the present invention is that (1) The varactor bias should be regulated by a bias regulator circuit which has a response time corresponding to a frequency which is at least 10% of the minimum frequency of oscillation of the RF oscillating circuit of which the varactor is a part, and (2) The impedance between the bias regulator circuit and the varactor must be kept as low as possible.

In the sample embodiment primarily discussed, the varactor bias regulator circuit is off-chip from the varactor RF oscillator. However, it is contemplated that in future preferred embodiments the varactor bias regulator circuit can be integrated with the RF oscillating circuit. This has the advantage of further reducing the inductance between the varactor bias regulator and the varactor itself, which is desirable. This interface is also thereby made more reliable and more controllable, since bond wire lead inductances are not required.

The emitter follower circuit of FIG. 1 is a sample embodiment of the invention, but other circuits can be used. It is necessary that the regulator circuit be a relatively high-frequency circuit, because of the speed with which parametric oscillation modes can develop in the RF circuit which the varactor is part of. Preferably the bias regulator circuit, including the inductive impedance intervening between the bias regulator circuit and the varactor itself, is able to respond at at least 10% of the highest RF frequency (within the operating range of the RF circuit of which the varactor is a part) at which the varactor generates a substantial rectified current component. More generally, the varactor bias regulator circuit preferably has a maximum response frequency which is at least 10% of the minimum frequency of oscillation of the RF circuit of which the varactor is a part.

Thus, the present invention provides major advantages of reliability, spectral purity, and uniformity and reproducibility over prior art varactor circuits.

The present invention is particularly advantageous in varactor-controlled voltage controlled oscillators which are used for local oscillators in microwave receiver circuits, or in other downconverter circuits. However, the present invention may also be advantageous in suppressing parametric oscillation modes in other microwave circuits which use varactors.

In the receiver application, the greater spectral purity of the varactor-controlled voltage-controlled oscillator (VCO) local oscillator of the present invention is particularly advantageous, since it means lower noise in the downconverted signal and greater tuning accuracy. These advantages in turn mean that following stages can be less complex.

The problem of RF rectification to produce dynamic self-biasing in varactors is particularly a problem when the varactor is a hyperabrupt varactor, and therefore the present invention is particularly advantageous when used in wide-band microwave voltage-controlled oscillators or wide-band microwave receivers.

Another way of regarding the advantages of the invention is that it permits use of varactors even at points within their range where a substantial rectified current is generated—i.e., for a given varactor device structure, the lower limit of the tuning range can be extended.

According to the present invention there is provided: A microwave varactor circuit comprising: a varactor; a microwave oscillating circuit connected to said varactor and having a minimum and a maximum microwave frequency of oscillation; a varactor bias regulator, connected to said varactor to supply a bias voltage thereto; said bias regulator having a response time corresponding to a frequency which is at least 10% of said minimum microwave frequency of oscillation; said bias regulator being connected to said varactor with an intervening impedance which is less than 10 ohms at said minimum microwave frequency of oscillation.

BRIEF DESCRIPTION OF THE DRAWING

The present invention will be described with reference to the accompanying drawings, wherein.

DESCRIPTION OF THE PREFERRED EMBODIMENTS

The present invention will be described with reference to a sample embodiment of the present invention. However, it will be recognized by those skilled in the art that the present invention is of extremely wide applicability, and can be used in a great variety of microwave circuits using varactors.

Figure 1:
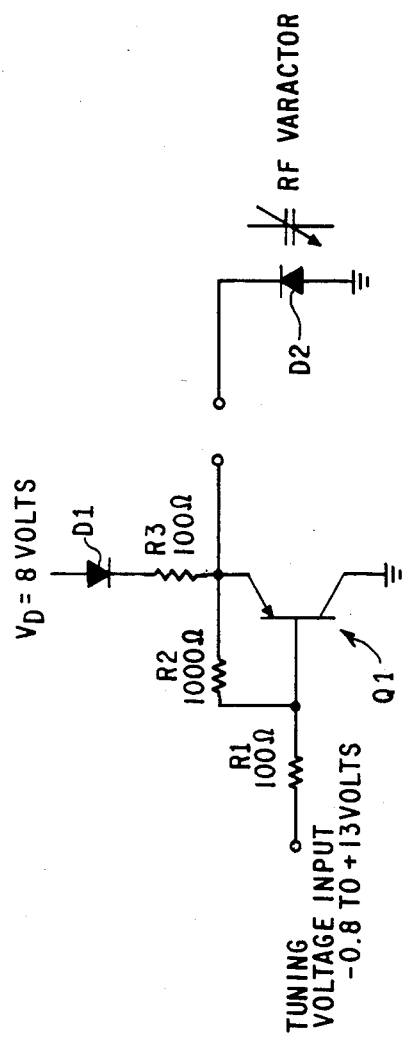
FIG. 1 shows a sample embodiment of the invention, wherein an emitter-follower circuit provides varactor bias voltage regulation for the RF varactor in a microwave oscillator circuit.

The circuit given in FIG. 1 is a sample embodiment of the invention. The varactor bias regulator circuit is configured as a basic emitter follower circuit which allows a current to flow from the emitter to collector of Q1 which is larger than that which can be delivered by rectification in the RF varactor. The RF rectified current from the varactor can replace the DC current from the emitter follower curcuit, but the DC voltage across the varactor will remain constant. The supply voltage will increase due to inductive back-voltage, but the tuning voltage will not be affected.

Since this entire circuit topology can be implemented in chip form (and optionally incorporated on a VCO chip) the inductance and other parasitics will not affect operation.

The diode D1 in FIG. 1 is used to turn the circuit off when the input voltage exceeds the transistor drop plus the diode drop. In a sample embodiment, this diode is actually implemented using another 2N2907 transistor chip on an alumina circuit to isolate the collector from ground. The base collector junction of this second transistor is used for the diode. The 2N2907 transistor used as the active device is placed on the ground plane (VCO housing) which returns the collector to ground and eliminates any parasitics in its path.

The 100 ohm resistor R1 in the base lead prevents the tuning network from being affected, if the RF varactor D2 shorts out when a number of VCO circuits are tuned in parallel from one tuning network.

The 1000 ohm resistor R2 is used to transfer the tuning voltage, after the transistor network is turned off (i.e. when the tuning voltage input exceeds the Vd minus the diode drop and the base emitter drop), to the varactor D2.

At very high bias voltages, near the breakdown of the RF varactor D2, the 1000 ohm resistor R2 limits the current drawn to a value which will not destroy the varactor.

One class of particularly attractive embodiments of the invention integrates a varactor bias regulator network with a monolithic microwave voltage-controlled oscillator including one or more FETS integrated with a wide-ratio varactor.

In a sample embodiment of this type, the varactor includes interdigitated anode and cathode patterns laid out on a single thin epitaxial layer. The punch through voltage of the epitaxial layer, and hence the resistivity-thickness product of the epitaxial layer, must be low. Since the substrate is semi-insulating, punch through to the substrate does not become uncontrollable, but simply permits modulation of the capacitance over a very wide range. The FETS are formed in the same epitaxial layer with the varactor, and complicated doping profiles are not required.

In one attractive subclass of embodiments of this type, two monolithic varactors are integrated with one FET. One of the varactors is used to provide the necessary variable capacitance for the VCO, and the other varactor is used to maintain impedance matching in the source circuit of the VCO. In addition, conventional reactive elements are also used to provide matching. A varactor bias-regulating network is used to regulate the bias to the VCO tuning varactor, and optionally also to the impedance-matching varactor.

Figure 3:
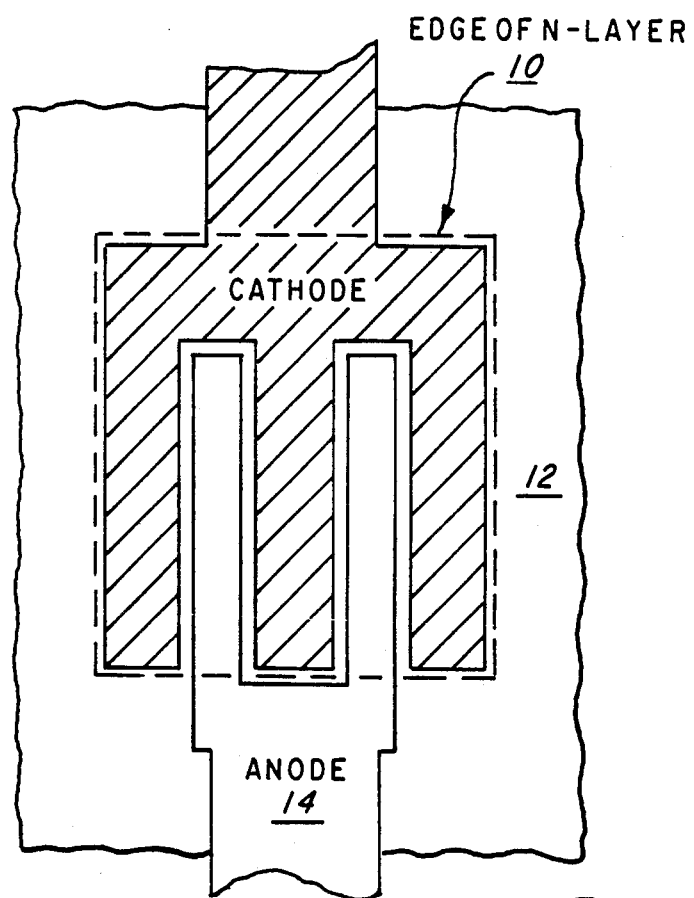

FIG. 3 is a top plan view of the varactor used in a sample embodiment of the present invention. Ion implantation (e.g., $5 \times 10^{12}/cm^2$ of Si at 200 keV) forms an n-type layer 10 on a semi-insulating substrate 12 (preferably Cr-doped GaAs). Alternatively epitaxial growth may be used to form the layer 10. An anode 14 and a cathode 16 are then formed in an interdigitated relation above the n-type layer 10. The anode forms a Schottky barrier with respect to the n-type layer 10, and the cathode 16 forms an ohmic contact.

Each finger of the anode is preferably 6 microns wide and 150 microns long. The anode is a deposited layer of, for example, Ti/Pt/Au. The spacing between the anode and cathode is nominally 2 microns.

Figure 2:
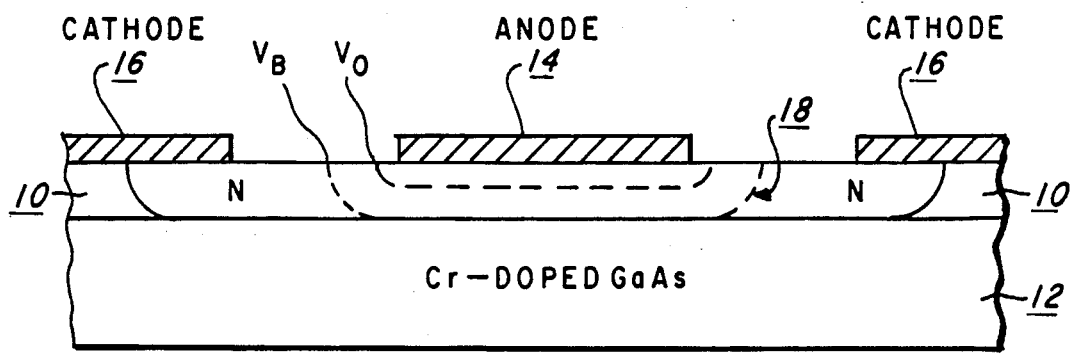
FIGS. 2 and 3 respectively show a section and a plan view of one varactor structure which may be used in the present invention.

FIG. 2 shows a cross section across one finger of the anode 14 and portions of two fingers of the cathode 16. The dotted lines VO and Vb show the respective depletion regions adjacent the anode at O volts and at the breakdown voltage, respectively. As these curves show, the effective area of the anode between the punch through voltage and the breakdown voltage is limited to only the approximately vertical portion 18 of the depletion boundary Vb. By contrast, at O bias the anode 14 has the effective area shown by the depletion boundary Vo, which is slightly larger than the physical area of the anode 14 itself.

Thus, a wide capacitance ratio is achieved, because the doping/thickness product of the epitaxial layer 10 is controlled to allow punch through before breakdown. In the preferred embodiment, the layer 10 is 300 nanometers thick. If the thickness is greater than 300 nm, the concentration of impurities should be reduced proportionately. At punch through, the effective diode area is reduced to that of the sidewall. As a result, a very large capacitance ratio is achieved by proper choice of the geometry.

In practice, a tradeoff must be made between the Q and the capacitance ratio. The Q is limited by the parasitic series resistance for current flowing laterally under the anode before punch through. Since the current beneath the anode is confined to the region of epitaxial layer 10 which lies beneath the depletion boundary and this layer becomes thinner as the depletion boundary approaches punchthrough, a large effective series resistance appears just before punchthrough.

After punchthrough, this series resistance is reduced to that of only the region from the vertical depletion boundary 18 to the cathode 16, and very high Q's are observed. This series resistance is, of course, larger if the finger width is larger.

Thus, this varactor diode may face problems due to rectification of the RF signal voltage at bias voltages below punchthrough, but will be far less likely to cause significant rectification at higher bias voltages.

To reduce the punchthrough voltage, a recess may be etched out under the whole surface of the anode, before the anode metallization is deposited. Thus, for example, where the layer 10 is 300 nanometers thick, 100 nanometers would be etched away before the anode is deposited. Thus, the punchthrough voltage is reduced, since the anode is accordingly closer to the substrate, whereas the breakdown voltage is not reduced, since the anode is no closer to the cathode. In fact, the breakdown voltage may be slightly increased, since the surface portions of the layer 10 are likely to be slightly more heavily doped than the lower portions of the layer 10. Since such recessed structures are frequently used for the channel regions of microwave FETs, to reduce the series resistance of the source and drain regions adjacent the channel, such an anode recess is also compatible with familiar microwave integrated circuit technology. An anode which is recessed in this fashion, to approximately ⅓ of the depth of the layer 10, constitutes the presently preferred embodiment of the varactor.

A sample varactor constructed for use in the present invention has a 6 by 150 micron Ti/Pt/Au anode finger placed between cathode areas two microns away. The layer 10 is 300 nm thick n-type ion implanted gallium arsenide, like that used for FETs. The substrate is chromium doped gallium arsenide. The anode is placed in a 100 nm etched recess, so that the anode is 200 nm above the substrate. In this embodiment, the capacitance decreases from 1.96 pF at O bias to 0.04 pF at $-7$ volts. This 40 to 1 capacitance ratio is achieved because of the extremely rapid capacitance decrease as punch through occurs between 5 and 7 volts. Calculated cutoff frequency for this diode is 28 GHz at O volts bias and 2.5 THz at 10 volts.

Of course, multi-finger embodiments of this planar varactor design may also be constructed.

The implantation parameters which optimize the n-type region 10 for construction of the varactor according to the present invention may be slightly different from those used to optimize the epitaxial layer for construction of FETs. For example, a slightly lower implantation dose (e.g. $3 \times 10^{12}/cm^2$) at a slightly higher energy (e.g. 400 KeV) would be used to construct a varactor according to the present invention, to obtain higher breakdown voltage. Thus, selective implantation of a monolithic chip containing both varactors and FETs would permit optimization of performance. However, the required characteristics for FETs and for the varactor according to the present invention are sufficiently close that, although selective implantation can provide a marginal advantage and performance, it is not required.

Passivation, in the presently preferred embodiment, is achieved by the following sequence of processing steps: first, the cathode metallization is deposited. Then 1000 Angstroms of silicon nitride are deposited over the whole surface of the device. The anode recess is then patterned and etched, to approximately ⅓ of the thickness of the layer 10. The anode metallization is then deposited, and any necessary contacts are then formed. Finally, 30,000 Angstroms more of silicon nitride are deposited overall. Clean-up, at appropriate intermediate points of the process, is performed using, e.g., ammonium hydroxide and water.

To further improve varactor performance, by further increasing the breakdown voltage, additional steps may alternatively be inserted to reduce the density of surface states. For example, an additional etching step may be applied overall, after the anode has been deposited, or an additional reagent may be used for clean-up.

Nitride assisted lift-off, if used to form the anode 14, improves the breakdown voltage of the varactors of the present invention. This technique places the anode metal back from the edge of the etched recess, and passivates the surface of the gallium arsenide. The parameters for this process are well known to those skilled in the art. (see, e.g. Proceedings of the Cornell Conference on Microwave Semiconductor Devices, 1981, p. 157, "High Yield, Reproducible Process Techniques for Microwave GaAs FETs", G. E. Brehm, F. H. Doerbeck, W. R. Frensley, H. M. Macksey, and R. E. Williams).

As will be obvious to those skilled in the art, numerous modifications may be performed, within the scope of the inventive concepts described above, to construct a varactor for use in the present invention. For example, p-type material could be used in the layer 10, although different metal composition would be required to create a Schottky barrier contact. Other semiconductor materials could also be used, provided that a doped semiconducting layer was lattice-matched to a semi-insulating substrate.

Figure 5:
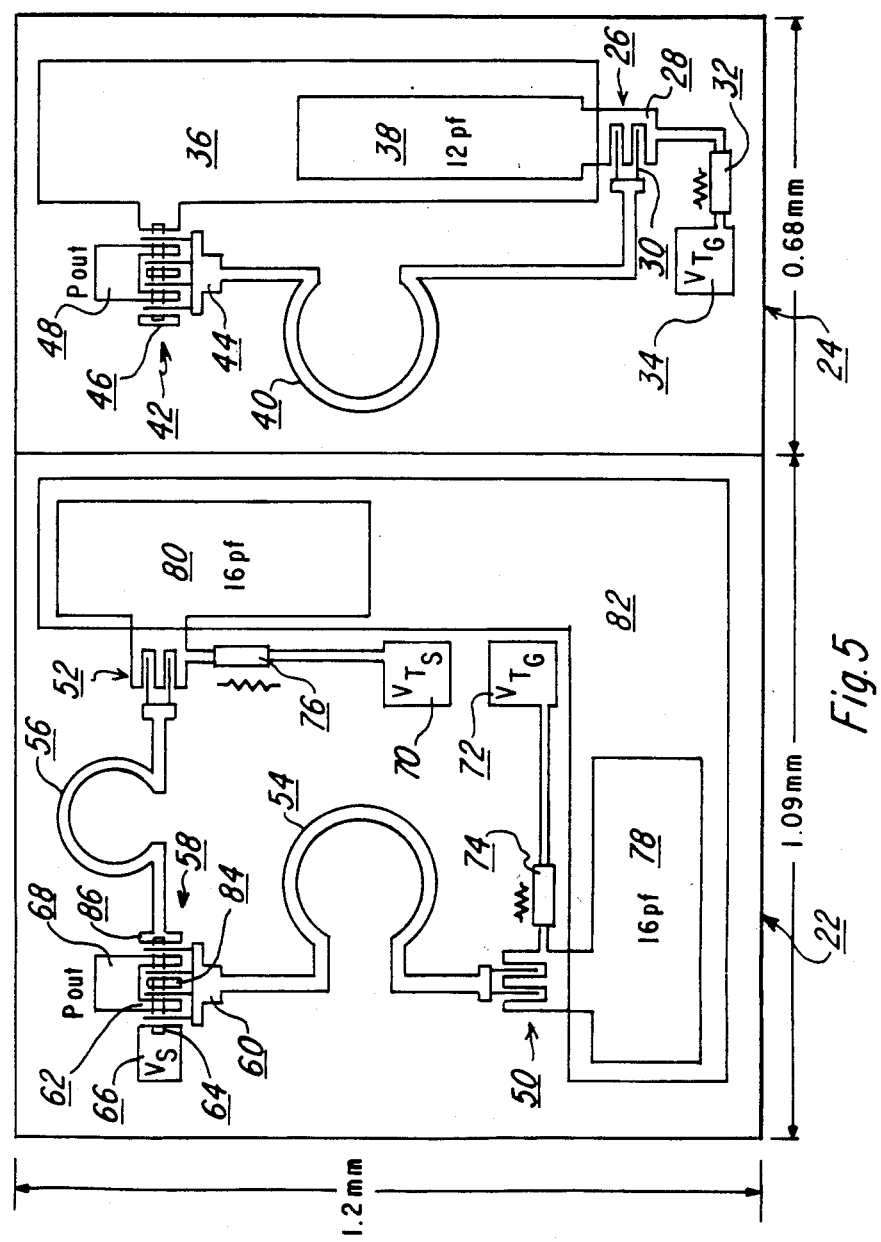
FIG. 5 shows two examples of integrated microwave wideband VCOs which may be used with off-chip varactor bias regulator circuits according to the present invention.

Two embodiments of integrated microwave wideband VCOs which may be used with varactor bias regulator circuits according to the present invention are shown in FIG. 5. The VCO circuit 22, shown on the left, is a "common gate" oscillator, having loop inductors 54 and 56 and varactors 50 and 52 respectively connected from the gate and source terminals of FET 58 to RF ground. MIM capacitors 78 and 80 (each numeral 16pF) to ground are used for RF bypassing, and 2.5 kilohm GaAs resistors are included at 74 and 76 are included in the high impedance bias lines to help suppress low frequency oscillations, to aid in isolating the DC bias lines from RF, and to act as a DC current limit. Bonding pads 72 and 70 are respectively provided for the gate and source tuning varactor voltages and pad 66 for DC-grounding of the source 64. External means of biasing the drain 62 and of matching the drain output 68 to 50 ohms must be provided.

No DC return is provided for the gate, since the bias point for the gate is established by clipping the RF gate voltage. This occurs in the FET 58, as described below.

While the structure of the FET is in almost all respects conventional, it does have one important feature which cooperates in the novel operation of the VCO according to the present invention. The gate fingers form a Schottky barrier with the channel region, and thus RF voltages in the gate circuit are clipped by the Schottky barrier to form the necessary gate bias. This has the outstanding advantage that the gate tuning network in the present invention consists simply of the inductor 54 and the varactor 50, and other circuits normally required to establish the gate operating point, which would have high frequency resonances, are not included. This permits easy operation of a microwave oscillator over an extremely broad bandwidth.

Thus, the processing steps required to form the monolithic VCO in accordance with the present invention, as described above, are as follows: the starting material is an n-type epitaxial (or implanted) layer on a semi-insulating substrate, preferably n-type GaAs on a Cr-doped GaAs substrate.

1. A mesa etch step is first. Photoresist is applied and patterned, and the epitaxial layer is then etched accordingly, to remove all portions of the epitaxial layer which are not needed. For example, portions of the epitaxial layer are left where the varactors 50 and 52 will be formed, and where the channel region of FET 58 will be formed. Portions of the epitaxial layer are also used to form the resistance elements 74 and 76.

2. Alignment marks are then deposited and etched, to provide E-beam control. A silicon nitride protective layer, of e.g. 1000 Angstroms, is then deposited only over the align marks. (Alignment marks are not shown within the VCO 22 of FIG. 5, but the positioning and use of E-beam alignment marks within a wafer is well known to those skilled in the art.)

3. Ohmic contacts are then formed. Photoresist is deposited and patterned to form the source and drain regions of FET 58, and the respective cathodes of varactors 50 and 52. Au/Ge/Ni is then deposited, lift-off is performed, and alloying is then performed, all conventionally.

4. The next stage is gate patterning. 1000 Angstroms of silicon nitride is deposited over all. E-beam resist is deposited, and E-beam patterning is then applied to define the gate fingers of FET 58 and the anode fingers of varactors 50 and 52. The silicon nitride in these patterns is then etched, and the epitaxial layer is then etched, to approximately one third of its thickness, where it has been exposed. Thus, where the epitaxial layers 3000 Angstroms thick, approximately 1000 Angstroms will be etched away in the present step. Ti/Pt/Au is then deposited, to form Schottky barriers to the epitaxial layer within these etched recesses, for the gate and anodes. Lift-off is then performed.

5. A first-level metallization step is then performed. 4000 Angstroms of silicon nitride is deposited overall, and photoresist patterning and etching of the nitride is performed (conventionally) to define the first metallization. This includes the bottom plate 82 of the capacitors 78 and 80, the inductors 54 and 56, the contact pads 66, 68, 70 and 72, and most of the remaining wiring. The patterning at this stage also exposes the source and drain fingers of the FET in the cathodes of the varactors 50 and 52, so that more metal is deposited on these structures to lower their resistance. Lift-off is then performed conventionally.

6. A top plate patterning step is then applied. First, 3000 angstroms of silicon nitride are deposited overall. This nitride forms a passivating layer over the varactors 50 and 52, and also forms the dielectric layer of the two RF-grounding capacitors 78 and 80. The top plates of capacitors 78 and 80 are then patterned (using photoresist), and TiAu is then deposited. Lift-off is then conventionally performed.

7. Finally, air-bridge connections are formed. First, photoresist is patterned to form vias, where (e.g.) the air bridge 64 contacts the source contact 66, the middle source finger 84, and the source finger 86. Nitride etching is then performed where the vias have been patterned, and pure gold is deposited by sputtering. The photoresist is not removed, but is left in place, since it will be needed to support the air-bridge 64. A further layer of photoresist is then deposited, and patterned to form the actual air bridge connection, and gold is then deposited by electroplating. All photoresist is then stripped. As is well-known in the art, such air-bridge structures have the advantage of reducing stray capacitance. For clarity, only one air-bridge connection is shown in FIG. 5 (across the source fingers of FET 58), but air-bridge connections are also generally used to connect first and second level metallizations. Thus, air-bridges are also preferably formed between varactor 50 and the top plate of capacitor 78, and between varactor 52 and capacitor 80.

Thus, the monolithic VCO 22 is connected to a power supply across source terminal 66 and drain terminal 68, and provides oscillator output power at terminal 68. The source tuning terminal 70 and the gate tuning terminal 72 are used to provide bias voltages which respectively control the varactors 52 and 50. The varactor 50 is the primary tuning reactance for the VCO, and the varactor 52 is used to tune the source circuit, to provide optimal matching for broad-band capability.

The VCO 24 is generally similar, but the source-matching circuit is not included. The VCO 24 includes an FET 42, an inductance 40 and varactor 26 in the gate line of FET 42, and an RF-grounding capacitor 38 and a bias supply 32 and 34 connected to the cathode of the varactor 26. Since this VCO 24 does not have the source-matching circuit to provide wide-band impedance matching, its potential bandwidth is only about 25% of that of the VCO 22. However, the VCO 24 does provide two advantages over the VCO 22. First, the VCO 24 is physically smaller. Second, the VCO 24 is preferably operated in the common-drain mode, i.e. the polarities of the off-chip source and drain connections are reversed from those used with VCO 22. Where the VCO 24 is constructed with 300-micron total gate width, the source terminal provides an output impedance very close to 50 ohms, so that no separate impedance-matching is required. Thus, where the broad-band capabilities of VCO 22 are not required, VCO 24 may be preferable. Like the VCO 22, the VCO 24 contains the innovative provision discussed above for gate bias, without any DC return line.

The sample monolithic VCOs shown in FIG. 5 are not shown with bias regulating circuits according to the present invention. They may be used with on-chip or off-chip bias regulators.

In the FET technology discussed above, the varactor bias regulator is preferably configured using a source-follower rather than an emitter-follower. Transistor Q1 is simply replaced with a MESFET device. However, the MESFET device is preferably rather large: for example, if the regulator circuit must be able to sink 30 mA of RF current generated by rectification, a 200 micron wide FET can be used as transistor Q1.

Alternatively, in III-V device technologies which provide bipolar devices, a monolithic bipolar device may again be used to configure an emitter follower.

Figure 4B:
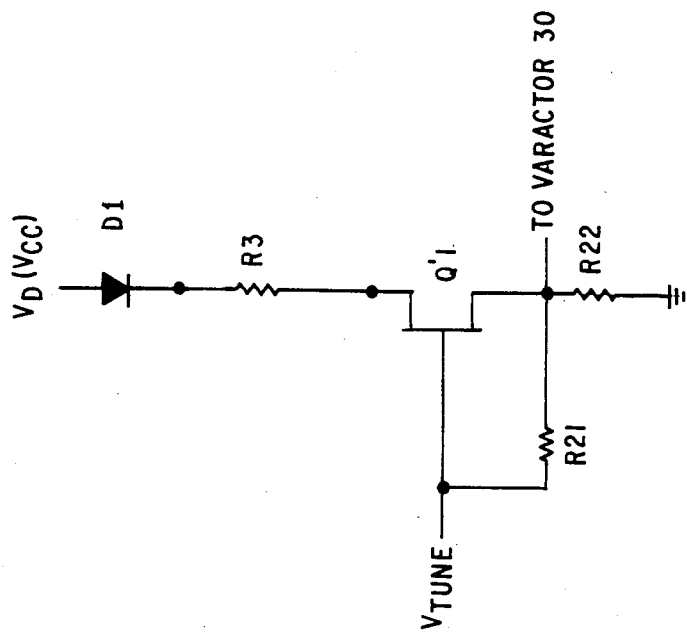
FIGS. 4A and 4B show a sample monolithic voltage-controlled oscillator integrated circuit according to the present invention, which includes a varactor bias regulator network on-chip.
Figure 4A:
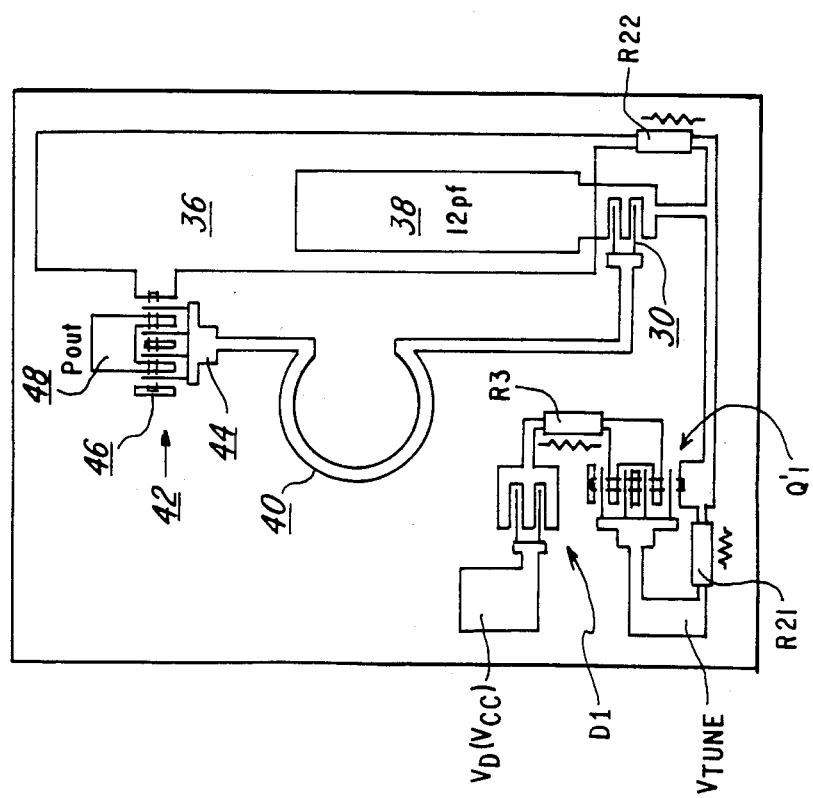

FIG. 4A shows a sample layout of a monolithic VCO according to the present invention, which incorporates a varactor bias regulator network on-chip. The oscillator portion of FIG. 4A is essentially the same as VCO 24 on the right side of FIG. 5, and is fabricated using the same steps; however, a wide MESFET Q1 prime is also fabricated using the same process steps as active devices 42, 50, 58, and 26, and resistors R3, R21, and R22 are also fabricated using the same steps as resistors 32, 74, and 76. This structure provides major advantages as discussed above.

FIG. 4B shows the equivalent circuit diagram of the varactor bias voltage regulator network shown in FIG. 4A. A MESFET Q1 prime is used n place of the bipolar device Q1 shown in the emitter-follower embodiment of FIG. 1. A diode D1 (in this sample layout) is built using the same device structure as varactor 30, and drain resistor R3 performs essentially the same function as resistor R3 in FIG. 1. The resistor R2 shown in FIG. 1 is not used; instead, a shunt resistor R21 and a source resistor R22 are used. The source of the MESFET Q1 prime provides the regulated bias supply to varactor 30.

In the layout of FIG. 4A, the regulator FET Q1 prime has the same dimensions as oscillator FET 42; this is not strictly necessary, but it is desirable that the FET Q1 prime should have at least half the gate width of the oscillator FET 42, in order to be able to sink enough rectified RF current.

The structure of FIG. 4 may also be integrated with other elements on-chip, to provide, for example, a complete microwave receiver.

The present invention can be widely modified and varied, and the specific embodiments discussed are merely illustrative and not limiting. The scope of the present invention is therefore not defined except by the allowed claims.

What is claimed is:
1. A microwave varactor circuit comprising:
a varactor;
a microwave oscillating circuit connected to said varactor and having a minimum and a maximum microwave frequency of oscillation;
a varactor bias regulator, connected to said varactor to supply a bias voltage thereto;
said bias regulator having a response time corresponding to a frequency which is at least 10% of said minimum microwave frequency of oscillation;
said bias regulator being connected to said varactor with an intervening impedance which is less than 10 ohms at said minimum microwave frequency of oscillation.
2. The varactor circuit of claim 1, wherein
said varactor has a substantial rectification capability at frequencies near said minimum frequency but not at frequencies near said maximum frequency,
and said bias regulator together with said intervening impedance has a maximum frequency which is at least 10% of the highest frequency at which said varactor has a substantial rectification capability.
3. The varactor circuit of claim 1, wherein
said bias regulator circuit substantially comprises an emitter follower circuit including a bipolar transistor.
4. The varactor circuit of claim 3, wherein
said varactor controls the oscillating frequency of said microwave oscillating circuit in response to said bias voltage,
and said varactor has a substantial rectification capability at frequencies near said minimum frequency but not at frequencies near said maximum frequency,
and said bias regulator circuit comprises means for bypassing said bipolar transistor at bias voltages corresponding to said maximum frequency.
5. The varactor circuit of claim 3, wherein
said emitter follower circuit conducts current through at least some part thereof at any value of said bias voltage.
6. The varactor circuit of claim 1, wherein
said maximum frequency is more than twice said minimum frequency.
7. The varactor circuit of claim 1, wherein
said minimum frequency is more than 1 GHz.
8. The varactor circuit of claim 1, wherein
said bias regulator circuit and said varactor are integrated on a common monolithic semiconducting substrate.
9. A monolithic microwave voltage-controlled oscillator (VCO), comprising:
a monocrystalline substrate;
a first field-effect transistor (FET) formed in an epitaxial semiconducting layer on said substrate, said transistor comprising a mutually interdigitated source and drain, and a gate interposed between said source and said drain;
an input contact connected to a first one of said source and said drain, and an output contact connected to the other one of said source and said drain;
a varactor, comprising an anode and a cathode and a portion of an epitaxial semiconducting layer on said substrate intermediate therebetween; and
bias voltage regulator means including a current sink connected to provide a bias voltage to one of said anode and said cathode of said varactor,
said gate of said first FET being connected to the other one of said anode and said cathode of said varactor.
10. The VCO of claim 9, wherein said substrate comprises chromium-doped gallium arsenide.
11. The VCO of claim 9, further comprising
a capacitor including first and second metal plates and a dielectric therebetween,
said first plate of said capacitor being connected to said other one of said anode and said cathode of said varactor,
and said second metal plate of said capicator being connected to said drain of said first FET.
12. The VCO of claim 9, further comprising an inductance interposed between said gate of said first FET and said other one of said anode and said cathode of said varactor.
13. The VCO of claim 9, wherein the total length of said gate is approximately 300 microns.
14. The VCO of claim 9, wherein said source and said drain of said first FET define a channel region therebetween within said semiconductor layer, and wherein said gate of said first FET forms a Schottky barrier with respect to said channel region.

15. The VCO of claim 9, wherein no pathway for DC return exists between said gate and said source nor between said gate and said drain.

16. The VCO of claim 9, wherein said bias voltage means comprises a source-follower circuit including a second FET formed in an epitaxial semiconducting layer on said substrate.

17. The VCO of claim 16, wherein said second FET has a gate width at least one half that of said first FET.

18. The VCO of claim 9, wherein said varactor comprises
an anode and a cathode formed on said semiconductor layer,
said anode and cathode being co-adjacent and spaced apart from each other,
said anode forming a Schottky barrier with said semiconductor layer,
the portion of said semiconductor layer beneath said anode being sufficiently thin and sufficiently lightly doped that punch through between said anode and said substrate occurs at a lower voltage than does breakdown between said anode and said cathode.

19. A monolithic microwave voltage-controlled oscillator (VCO), comprising:
a monocrystalline substrate;
a first bipolar transistor formed in an epitaxial semiconducting layer on said substrate, said transistor comprising an emitter, a collector, and a base interposed between said emitter and said collector;
an input contact connected to a first one of said emitter and said collector, and an output contact connected to the other one of said emitter and said collector;
a varactor, comprising an anode and a cathode and a portion of an epitaxial semiconducting layer on said substrate intermediate therebetween; and
bias voltage regulator means including a current sink connected to provide a bias voltage to one of said anode and said cathode of said varactor,
said base of said first transistor being connected to the other one of said anode and said cathode of said varactor.

20. The VCO of claim 19, wherein said bias voltage means comprises an emitter-follower circuit including a second bipolar transistor formed in an epitaxial semiconducting layer on said substrate.

21. A monolithic microwave voltage-controlled oscillator (VCO), comprising:
a monocrystalline substrate;
a first field-effect transistor (FET) formed on said substrate, said transistor comprising a mutually interdigitated source and drain, and a gate interposed between said source and said drain;
an input contact connected to a first one of said source and said drain, and an output contact connected to the other one of said source and said drain;
a varactor on said substrate, comprising an anode and a cathode; and
bias voltage regulator means including a current sink connected to provide a bias voltage to one of said anode and said cathode of said varactor,
said gate of said first FET being connected to the other one of said anode and said cathode of said varactor.

22. The VCO of claim 21, further comprising
a capacitor including first and second metal plates and a dielectric therebetween,
said first plate of said capacitor being connected to said other one of said anode and said cathode of said varactor,
and said second metal plate of said capacitor being connected to said drain of said first FET.

23. The VCO of claim 21, further comprising an inductance interposed between said gate of said first FET and said other one of said anode and said cathode of said varactor.

24. The VCO of claim 21, wherein the total length of said gate is approximately 300 microns.

25. The VCO of Claim 21, wherein said source and said drain of said first FET define a channel region therebetween within said semiconductor layer, and wherein said gate of said first FET forms a Schottky barrier with the respect to said channel region.

26. The VCO of claim 21, wherein no pathway for DC return exists between said gate and said source nor between said gate and said drain.

27. The VCO of claim 21, wherein said bias voltage means comprises a source-follower circuit including a second FET formed on said substrate.

28. The VCO of claim 27, wherein said second FET has a gate width at least one half that of said first FET.

29. The VCO of claim 21, wherein said varactor comprises
an anode and a cathode formed on said semiconductor layer,
said anode and cathode being coadjacent and spaced apart from each other,
said anode forming a Schottky barrier with said semiconductor layer,
the portion of said semiconductor layer beneath said anode being sufficiently thin and sufficiently lightly doped that punch through between said anode and said substrate occurs at a lower voltage than does breakdown between said anode and said cathode.

30. A monolithic microwave voltage-controlled oscillator (VCO), comprising:
a monocrystalline substrate;
a first field-effect transistor (FET) formed on said substrate, said transistor comprising a mutually interdigitated source and drain, and a gate interposed between said source and said drain;
an input contact connected to a first one of said source and said drain, and an output contact connected to the other one of said source and said drain;
a varactor on said substrate, comprising an anode and a cathode; and
a bias voltage regulator, connected to provide a bias voltage to one of said anode and said cathode of said varactor, comprising a source-follower circuit including a second FET formed on said substrate, said second FET having a gate width at least one half that of said first FET;
said gate of said first FET being connected to the other one of said anode and said cathode of said varactor.

* * * * *